Figure 1:
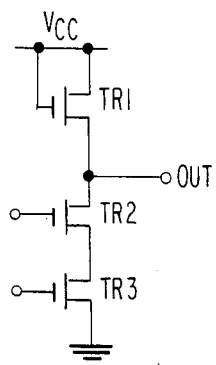

United States Patent [19]

Eguchi

[11] Patent Number: 4,635,088
[45] Date of Patent: Jan. 6, 1987

[54] HIGH SPEED-LOW POWER CONSUMING IGFET INTEGRATED CIRCUIT

[75] Inventor: Hirotugu Eguchi, Tokyo, Japan
[73] Assignee: Nippon Electric Co., Ltd., Japan
[21] Appl. No.: 661,837
[22] Filed: Oct. 17, 1984

Related U.S. Application Data

[63] Continuation of Ser. No. 240,434, Mar. 4, 1981, abandoned.

[30] Foreign Application Priority Data

Mar. 10, 1980 [JP] Japan .................................. 55-29972

[51] Int. Cl.[4] ..................... H01L 29/78; H01L 27/02; H01L 23/48
[52] U.S. Cl. ................................... 357/41; 357/23.14; 357/46; 357/65; 357/68
[58] Field of Search ................... 357/23.14, 40, 41, 42, 357/45, 46, 65, 68

[56] References Cited

U.S. PATENT DOCUMENTS

| | | | |
|---|---|---|---|
| 3,660,697 | 5/1972 | Berglund et al. | 357/23.1 |
| 3,932,884 | 1/1976 | Kitamura | 357/41 |
| 3,967,988 | 7/1976 | Davidsohn | 357/41 |
| 4,042,839 | 8/1977 | Araki | 307/450 |
| 4,069,427 | 1/1978 | Masuda | 307/481 |
| 4,084,173 | 4/1978 | Fanteehi | 357/42 |
| 4,142,197 | 2/1979 | Dingwoll | 357/46 |
| 4,235,010 | 11/1980 | Kawagoe | 357/41 |
| 4,384,218 | 5/1983 | Shimotori et al. | 307/304 |
| 4,389,582 | 6/1983 | Suzuki et al. | 307/452 |
| 4,412,237 | 10/1983 | Matsumura et al. | 357/42 |

Primary Examiner—J. Carroll
Attorney, Agent, or Firm—Sughrue, Mion, Zinn, Macpeak, and Seas

[57] ABSTRACT

An improved semiconductor device operable at a high-speed and with a low power consumption is disclosed. The device comprises a common impurity-doped region, a first insulated gate field effect transistor utilizing the common impurity-doped region as a drain thereof, a second insulated gate field effect transistor utilizing the common impurity-doped region as a drain thereof, control means for controlling switching operations of the first and second transistor at the same time and means for deriving an output signal from the common impurity-doped region.

6 Claims, 10 Drawing Figures

HIGH SPEED-LOW POWER CONSUMING IGFET INTEGRATED CIRCUIT

This application is a continuation of U.S. patent application Ser. No. 240,434, filed Mar. 4, 1981 and now abandoned.

The present invention relates to an integrated circuit, and more particularly, to a semiconductor integrated circuit having insulated gate field effect transistors.

Insulated gate field effect transistors (hereinafter abbreviated as IGFET's) have been widely utilized in digital integrated circuits because they are suitable for high-density circuit integration and can operate at a low power consumption. The basic operation of an IGFET as a logic element in a digital circuit is such that an input signal is applied to its gate to control the ON and OFF states of IGFET and an output signal in response to the input signal is derived from its drain or source. In a digital logic circuit, a combination circuit such as NOR circuits, NAND circuits, etc. and a sequential circuit such as a flip-flop, shift register, etc. are used in various combinations depending upon logic function and application. Such digital logic circuits can be deemed to be basically a combination of AND circuits, OR circuits and NOT circuits. Especially, in a complementary IGFET integrated circuit, the circuit construction is clear and definite.

As is well known, an IGFET is a voltage-responsive logic element, with its gate being deemed to be equivalent to a capacitor. A signal source for supplying an input signal to the gate and wirings leading from the signal source to the gate, respectively, have finite impedances. Consequently, the response to an effective signal level at the gate of an IGFET is necessarily delayed by a time constant formed by the gate capacitance of the IGFET and the aforementioned impedances. This makes it difficult to realize high-speed logic operations. Moreover, since an electric charge stored in the gate capacitance is repeatedly charged and discharged upon respective switching operations, it has been also difficult to further reduce power consumption. In addition, not only the gate capacitance of the IGFET, but also the capacitances of the source and drain of the IGFET serve to slow down the switching operations, and at the same time these capacitances are superposed on the gate capacitance of the IGFET in the next stage, resulting in the lowering of the speed of the logic operations of the circuit as a whole.

It is therefore one object of the present invention to provide an integrated circuit that can operate at a high speed.

Another object of the present invention is to provide an integrated circuit that can operate at a very low power consumption.

The principle of the present invention resides in that in an integrated circuit including a series circuit of a given number of IGFET's connected in series in their drain-source direction, each IGFET in the series circuit is divided into a pair of identical IGFET's having a conductance of a half of the original IGFET, and the series circuit is divided into two sub-series circuits: one sub-series circuit consisting of ones of the pairs of the divided IGFET's, the other sub-series circuit consisting of the other of the pairs of the divided IGFET's, the two sub-series circuits being connected in parallel. One of the junctions of the parallel-connected sub-series circuits can be made a common drain or source region of one pair of the divided IGFET's, so that the parasitic capacitance of the source or drain regions of that pair of the IGFET's is reduced.

According to one feature of the present invention, there is provided an integrated circuit comprising a plurality of transistor groups each consisting of a plurality of IGFET's connected in series, in which the same signal lines are distributed to the respective transistor groups to make the respective transistor groups achieve substantially the same logic operations, one end of each of the respective transistor groups being formed in common.

According to another feature of the present invention, there is provided an integrated circuit comprising a plurality of transistor groups each consisting of a plurality of IGFET's connected in series, in which the gate electrodes of such transistor groups are connected to the same signal lines according to the sequence of connection of the transistors in the respective transistor groups.

According to a more specific feature of the present invention, there is provided an integrated circuit comprising a semiconductor substrate provided with a region of one conductivity type, a first region of the opposite conductivity type having a rectangular shape and provided in said one conductivity type region, a plurality of second regions of the opposite conductivity type provided substantially parallel to one edge of said first region and isolated sequentially at discrete distances from said one edge and isolated from each other, a plurality of third regions of the opposite conductivity type provided substantially in parallel to another edge of said first region and isolated sequentially at discrete distances from said another edge and spaced from each other, a plurality of first conductive patterns provided via an insulating film on the respective regions between said one edge of said first region and the nearest one of said plurality of second regions and between adjacent ones of said second regions, that is, on the channel regions, a plurality of second conductive patterns provided via an insulating film on the respective regions between said another edge of said first region and the nearest one of said plurality of third regions and between adjacent ones of said third regions, that is, on the channel regions, a plurality of signal wirings each connecting one of said first conductive patterns to the corresponding one of said second conductive patterns, and a common wiring for connecting in common the second region located at the farthest end from said first region and the third region located at the farthest end from said first region, whereby an output signal can be derived from said first region.

In the integrated circuit according to the present invention, a parasitic capacitance especially of a drain region serving as an output node where charging or discharging is effected upon each switching, can be remarkably reduced without degrading a driving capability of a transistor. Accordingly, a logic integrated circuit that can achieve a high speed operation as well as a very low power consumption operation, is realized.

Figure 2A:
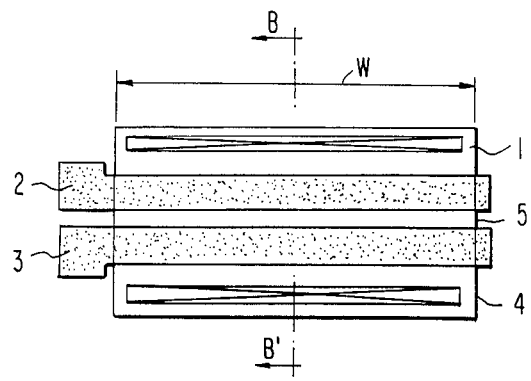
Figure 3:
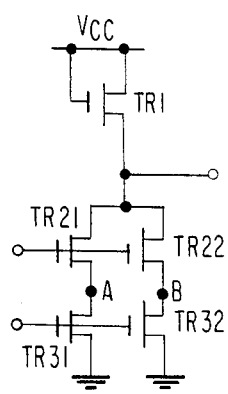
Figure 4A:
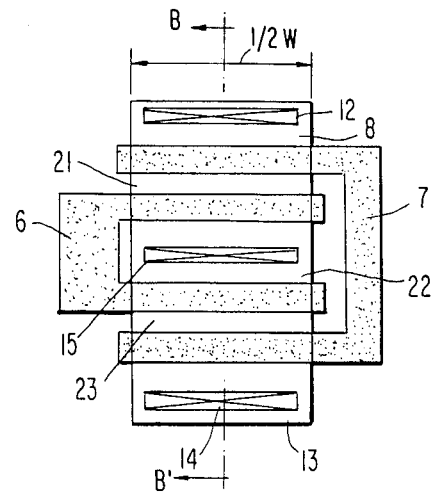
Figure 5:
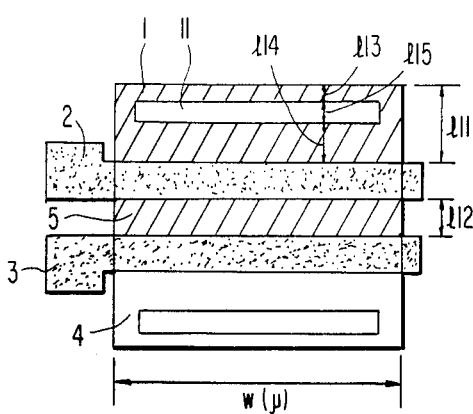
Figure 6:
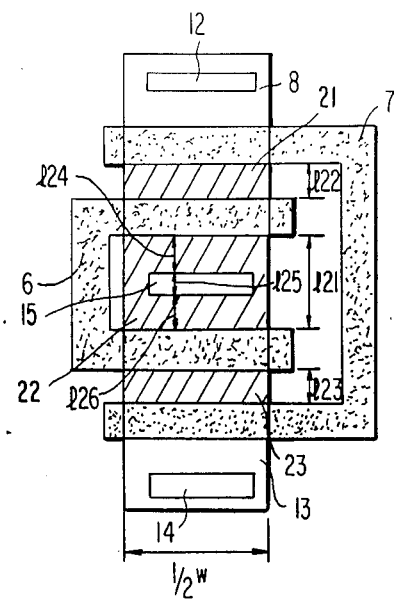
Figure 7:
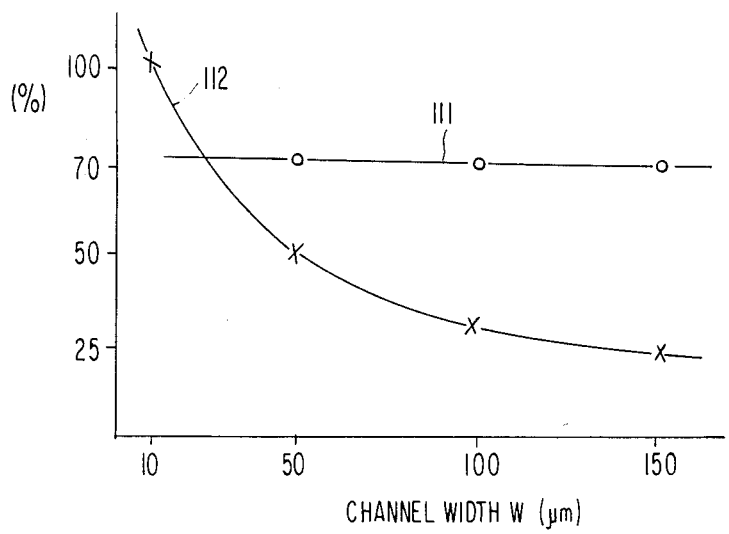
Figure 2B:
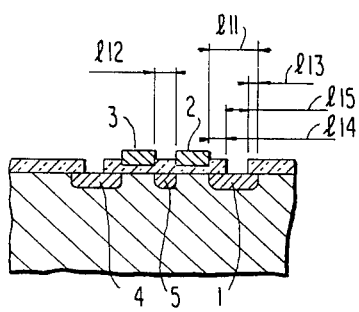
Figure 4B:
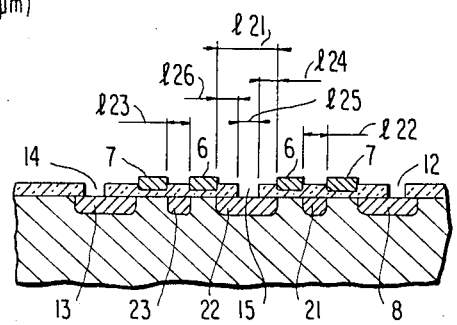
Figure 8:
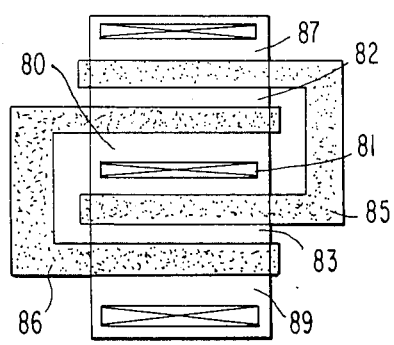

The above-mentioned and other features and objects of the present invention will become more apparent by reference to the following description of preferred embodiments of the invention taken in conjunction with the accompanying drawings, wherein:

FIG. 1 is a schematic circuit diagram showing a standard NAND circuit consisting of N-channel MOS transistors, FIG. 2A is a plan view of an integrated circuit in which the NAND circuit shown in FIG. 1 is realized according to the prior art, FIG. 2B is a cross-sectional view taken along the line B—B' of FIG. 2A, FIG. 3 is an equivalent circuit diagram of a NAND circuit constructed according to the present invention, FIG. 4A is a plan view of an integrated circuit according to the present invention as applied, by way of example, to a 2-input NAND circuit, FIG. 4B is a cross-sectional view taken along the line B—B' of FIG. 4A, FIG. 5 is a schematic plan view showing distribution of capacitances in the transistor layout shown in FIG. 2, FIG. 6 is a schematic plan view similar to FIG. 5 showing distribution of capacitances in the integrated circuit according to the present invention shown in FIG. 4, FIG. 7 is a diagram representing proportions in percent of a pattern area and a peripheral length according to the present invention with reference to those in the case of employing the art work method in the prior art as a function of a channel width W, and FIG. 8 is a layout diagram showing another preferred embodiment of the present invention.

Referring now to FIG. 1 of the drawings, there is shown a standard 2-input NAND circuit in the prior art, which is constructed of N-channel transistors. This circuit is composed of a load transistor TR1 and drive transistors TR2 and TR3. Normally the channel widths of the drive transistors TR2 and TR3 are identical to each other.

If the section of the drive transistors in this circuit is patterned according to the prior art method, the layout of the pattern will become as shown in FIGS. 2A and 2B. More particularly, a mere series connection of transistors TR2 and TR3 is formed by providing gate electrodes 2 and 3 between N-type regions 1 and 5 and between N-type regions 5 and 4, respectively. The region 4 which is not shared by the respective transistors is used as a ground terminal, while the region 1 is used as an output terminal (OUT). This method of patterning called "art work method" is simple and clear, and hence it is generally employed at present. However, in the case where the load to be driven is heavy, for the purpose of enhancing driving capabilities of the drive transistors TR2 and TR3, not to speak of the load transistor TR1, the widths W of channel regions and source, drain regions of these transistors must be enlarged. However, in accordance with the increase of the widths W, the areas of the respective diffusion regions are increased, and thus the capacitances at the respective nodes would be increased. Moreover, the resistances of the polycrystalline silicon layers forming the gate electrodes 2 and 3 of the drive transistors TR2 and TR3 would be also increase to an unnegligible extent.

Accordingly, even if driving the capabilities should be enhanced by enlarging the channel widths W, from the view point of speeding up the circuit an improvement proportional to the increase of the widths would not be achieved according to the prior art.

FIG. 3 shows a 2-input NAND circuit, which can achieve a similar function to the circuit shown in FIG. 1 and which embodies the basic principle of the present invention. In order that the circuit shown in FIG. 3 becomes equivalent to the circuit shown in FIG. 1, it is necessary that when the current amplification factors of the drive transistors TR2 and TR3 are represented by $\beta_2$ and $\beta_3$, respectively, and the current amplification factors of the drive transistors TR21, TR22, TR31 and TR32 are represented by $\beta_{21}$, $\beta_{22}$, $\beta_{31}$ and $\beta_{32}$, respectively, these amplification factors fulfill the conditions of:

$\beta_2 = \beta_{21} + \beta_{22}$,
$\beta_3 = \beta_{31} + \beta_{32}$.

By fulfilling these conditions, the necessity of connecting the drain electrode of the drive transistor TR31 (or the source electrode of the drive transistor TR21) at point A in FIG. 3 to the drain electrode of the drive transistor TR32 (or the source electrode of the drive transistor TR22) at point B is eliminated, and yet the circuit shown in FIG. 3 becomes equivalent to that shown in FIG. 1.

With reference to FIGS. 4A and 4B, one detailed embodiment of the present invention will be explained where only the section of drive transistors in the circuit shown in FIG. 3 is realized according to the present invention.

In FIGS. 4A and 4B, on one principal surface of a P-type semiconductor substrate are disposed N-type regions 8 and 21 serving as a source and a drain, respectively, of a transistor TR31, the N-type region 21 also serving as a source for a transistor TR21, an N-type region 22 serving as the drain of a transistor TR21 and also as the drain of the transistor TR22, an N-type region 23 serving as a source of the transistor TR22 and also as a drain of a transistor TR32, and an N-type region 13 serving as a source of the transistor TR32 as directed in the same direction. A polycrystalline silicon layer 6 forms a gate electrode wiring for the transistors TR21 and TR22, and a polycrystalline silicon layer 7 forms a gate electrode wiring for the transistors TR31 and TR32. From a contact 15 provided in the N-type region 22 is led out an output terminal OUT shown in FIG. 3. A source of a load transistor TR1 may be connected to the contact 15 by a known method (not shown). Contacts 12 and 14 provided in the N-type regions 8 and 13, respectively, are both connected to a grounded terminal of a power supply. In the layout shown in FIG. 3, the widths of the respective N-type regions are selected about ½ times as small as those in the layout shown in FIG. 2. As described above, according to the present invention, the capacitance of the region 22 corresponding to an output terminal which may possibly affect the circuit performance can be reduced as compared to an integrated circuit patterned according to the prior art method, owing to the fact that two sets of series patterns are formed by dividing the widths W of the transistors into two equal parts and patterning is effected so that the two series patterns may share a drain region at one ends.

Now the effects and advantages of the present invention will be explained in greater detail with reference to FIGS. 5 and 6. At first, consideration will be made on a capacitance of the drive transistors in the prior art shown in FIG. 2 as viewed from an output node contact 11 corresponding to an output terminal OUT in an output transistor section. In this case, a capacitance of a region 1 corresponding to the drain of the drive transistor TR2 and a capacitance of a region 5 corresponding to the source of the drive transistor TR2 and the drain of the drive transistor TR3 would affect the output. On the other hand, since a region 4 corresponding to the source of the drive transistor TR3 is fixedly held at the ground potential, the effect of the capacitance of this region 4 can be neglected.

In the respective cases shown in FIGS. 5 and 6, it is assumed hereunder that as a rule, in the drain region forming an output node, an interval of 4 microns is provided between the periphery of the output contact and the periphery of the gate electrode and an interval of 2 microns or more is provided between the output contact and the edge of the drain region. Also it is assumed that the length of the contact is 3 microns and the length of the minimum impurity region 5, 21, 23 is 4 microns. In FIG. 5, the length of the drain region 1 is represented by $l_{11}$, its width is represented by W. The length of the region 5 is represented by $l_{12}$ and the width of the same is also represented by W. In this figure, reference symbol $l_{14}$ designates the distance between the gate electrode 2 and the contact 11, which is 4 microns as described above. Reference symbol $l_{13}$ designates the distance between the contact 11 and the edge of the drain region 1, which is 2 microns. Reference symbol $l_{15}$ designates the length of the contact 11, which is 3 microns.

At first, denoting a bottom capacitance per unit area by reference symbol $C_A$, the capacitance $C_{11}$ formed between the bottom surfaces of the regions 1 and 5 and the substrate is represented by the following equation:

$$C_{11} = C_A \cdot (W \times l_{11} + W \times l_{12}) \quad (1)$$
$$= C_A \cdot W(l_{11} + l_{12}).$$

Substituting $l_{11}=9$ (microns) and $l_{12}=4$ (microns) into Equation (1) above, we obtain:

$$C_{11} = C_A \cdot W(9 + 4) \quad (2)$$
$$= 13 \cdot C_A \cdot W$$

On the other hand, the capacitance $C_{12}$ formed by the side surfaces (wall surfaces) of the regions 1 and 5 is represented by the following equation when the capacitance per unit length of the side surface is represented by reference symbol $C_B$:

$$C_{12} = C_B \cdot (2 \cdot l_{11} + W + 2 \cdot l_{12}) \quad (3)$$

Substituting the above-referred numerical values of the lengths $l_{11}$ and $l_{12}$ into Equation (3) above, we obtain:

$$C_{12} = C_B \cdot (2 \times 9 + W + 2 \times 4) \quad (4)$$
$$= C_B \cdot (28 + W)$$

Therefore, the total capacitance $C_{13}$ is represented by the following equation:

$$C_{13} = C_{11} + C_{12} \quad (5)$$
$$= W(13C_A + C_B) + 28C_B$$

Now consideration will be made of the preferred embodiment of the present invention shown in FIG. 4, with reference to FIG. 6. In this preferred embodiment, the widths of all the impurity regions serving as a drain or a source are chosen about ½ times as small as the width in the case of the prior art layout shown in FIG. 5. In this case, the capacitance as viewed from the output control 15 is equal to the sum of the capacitance of the region 21, the capacitance of the region 22 and the capacitance of the region 23. Similar to the case shown in FIG. 5, the capacitance $C_{21}$ formed by the bottom surfaces of the respective regions is represented by the following equation:

$$C_{21} = C_A \cdot (\tfrac{1}{2}W \cdot l_{21} + 2 \cdot \tfrac{1}{2}W \cdot l_{22}) \quad (6)$$

As mentioned previously in connection to FIGS. 5 and 6, the length $l_{25}$ is 3 microns and the lengths $l_{24}$ and $l_{26}$ are respectively 4 microns. Hence the length $l_{21}$ is equal to 11 microns, and also the lengths $l_{23}$ and $l_{22}$ are respectively 4 microns. Therefore, substituting these numerical values into Equation (6), we obtain:

$$C_{21} = C_A \cdot (\tfrac{1}{2}W \cdot 11 + W \cdot 4) \quad (7)$$
$$= 9.5 C_A \cdot W$$

Considering now the side surface capacitance $C_{22}$ in the same manner as described above, it is represented by the following equation:

$$C_{22} = C_B \cdot (2 \cdot l_{21} + 4 \cdot l_{22}) \quad (8)$$

Substituting the numerical values of the lengths $l_{21}$ and $l_{22}$ into Equation (8) above, we obtain:

$$C_{22} = 38 C_B \quad (9)$$

Accordingly, the total effective capacitance $C_{23}$ is given by the following equation:

$$C_{23} = C_{21} + C_{22} = 9.5 C_A \cdot W + 38 C_B \quad (10)$$

Now the capacitance reduction ratio R of the layout shown in FIG. 6 with respect to the prior art layout shown in FIG. 5 will be considered. A reduction ratio $R_{11}$ of the bottom surface capacitance is given by the following equation:

$$R_{11} = \frac{C_{21}}{C_{11}} = \frac{9.5 C_A \cdot W}{13 C_A \cdot W} = 0.73 \quad (11)$$

Also, a reduction ratio $R_{12}$ of the side surface capacitance is given by the following equation:

$$R_{12} = \frac{C_{22}}{12} = \frac{38 C_B}{28 C_B + C_B \cdot W} = \frac{38}{28 + W} \quad (12)$$

Thus it will be understood that the reduction ratio $R_{12}$ is substantially inversely proportional to the value of the width W.

Here, if the following numerical values are employed as representative values:

$$W = 150\mu$$
$$C_A = 2.3 \times 10^{-4} pF/\mu^2, \text{ and}$$
$$C_B = 4.0 \times 10^{-4} pF/\mu.$$

then according to Equation (5), the total effective capacitance $C_{13}$ becomes 0.5197 pF. On the other hand, according to Equation (10), the total effective capacitance $C_{23}$ becomes 0.3429 pF. Therefore, according to the present invention, a reduction in the total effective capacitance of as large as 34% can be achieved.

FIG. 7 shows the effects of the present invention on the basis of the above-mentioned results, in which capacitance proportions of the pattern area and peripheral length of the layout according to the present invention with respect to those of the layout formed by the art work method in the prior art which are used as a reference, are represented in percents. In this figure, a channel width W of the drive transistors is taken along the X-axis, and the capacitance proportions of the pattern area and peripheral length are taken in percents along the Y-axis. A curve 111 represents a reduction ratio $R_{11}$ of the pattern area, while a curve 112 represents a reduction ratio $R_{12}$ of the peripheral length as a function of the channel width W. It will be readily seen from FIG. 7 that the reduction ratio $R_{11}$ is held substantially constant at 73% for every value of the channel width W, whereas the reduction ratio $R_{12}$ is reduced as the channel width W is increased. Although comparison is made with respect to geometrical dimensions in FIG. 7, the effects of reducing the parasitic capacitances will be readily appreciated if the capacitance per unit area $C_A$ or the capacitance per unit length $C_B$ is taken into consideration.

Another preferred embodiment of the present invention is illustrated in FIG. 8, in which with respect to impurity regions 82 and 83 formed between an output node 80 and respective regions 87 and 89 to be held at the ground potential, common gates 85 and 86 are formed respectively in a pattern of rotational symmetry, and similar effects to those of the embodiment shown in FIG. 4 can be expected from this modified embodiment.

As described above, in general, capacitances of the impurity regions are represented by a sum of a term proportional to a pattern area and a term proportional to a peripheral length of a pattern, and the effects of the present invention making use of the above principle can be realized by placing a pattern of an output terminal between the gate polycrystalline silicon layers of the drive transistors TR21 and TR22, because in such a layout both the pattern area and peripheral length of the output region can be reduced. Moreover, since the proposed pattern layout is symmetric with respect to its longitudinal and transverse directions, even if any deviation should arise in pattern registration, the deviation would little affect the performance of the transistors. In addition, owing to the fact that the drive transistors are respectively divided into two parts, the resistance of the gate polysilicon layer is also reduced, and this contributes to reduction of a delay time. The above-mentioned effects of the present invention become more remarkable as the channel widths of the drive transistors are increased.

As described in detail above, according to the present invention, the circuit performance can be improved by merely making device on the art work without providing any special pattern, and since the pattern layout is symmetric with respect to its longitudinal and transverse directions, even if any deviation should arise in pattern registration, the driving capability as well as node capacitances of the transistor would be little varied. The above-described embodiments of the present invention are no more than one example employing N-channel transistors, and the invention is not limited to a circuit employing N-channel transistors but the invention can be equally applied to the art work of a circuit employing P-channel transistors or complementary transistors. Especially, if the invention is applied to the art work of a complementary IGFET integrated circuit, the frequency of use of the present invention is enhanced and thus it is favorable. In addition, as a matter of course, the present invention is equally applicable to a series construction consisting of three or more transistors.

I claim:

1. A semiconductor integrated circuit comprising a first and a second input terminal, a first insulated gate field effect transistor having a first gate electrode connected to said first input terminal, an output terminal connected to one end of said first transistor, a second insulated gate field effect transistor connected to the other end of said first transistor and having a second gate electrode connected to said second input terminal, a power supply terminal, and means connected between said power supply terminal and said output terminal for supplying electric charges to said output terminal, said first transistor including a first region of one conductivity type formed in a semiconductor substrate of the opposite conductivity type and having first and second sides extending in parallel in one direction, a second region of said one conductivity type formed in said substrate along said first side of said first region, said second region being elongated in said one direction in parallel with and not beyond said first side of said first region, a third region of said one conductivity type formed in said substrate along said second side of said first region, said third region being independently provided of said second region and extending in said one direction in parallel and not beyond said second side of said first region, a portion of said first gate electrode being disposed on a portion of said substrate between said first and second regions via a gate insulator and a remaining portion of said first gate electrode being disposed on a portion of said substrate between said first and third regions via a gate insulator, the both portions of said first gate electrode being connected in common to said first input terminal, said output terminal being connected to said first region, and said second transistor including said second region, a fourth region of said one conductivity type formed in said substrate along such a side of said second region that is opposite to said first region, said fourth region being elongated in said one direction in parallel with said second region with a length equal to that of said second region, a portion of said second gate electrode being disposed on a portion of said substrate between said second and fourth regions via a gate insulator and connected to said second input terminal, said third region, a fifth region of said one conductivity type formed in said substrate along such a side of said third region that is opposite to said first region, said fifth region being elongated in said one direction in parallel with said third region with a length equal to that of said third region, said fifth region being provided independently of said fourth region and a remaining portion of said second gate electrode being disposed on a portion of said substrate between said third and fifth regions via a gate insulator and connected to said second input terminal.

2. A semiconductor integrated circuit of claim 1, in which said first, second, third, fourth and fifth regions have the same length in said one direction.

3. A semiconductor integrated circuit of claim 2, in which said second and third regions are electrically floating and said fourth and fifth regions are supplied with a predetermined voltage.

4. A semiconductor integrated circuit comprising a semiconductor substrate provided with a first region of a first conductivity type, a first rectangular region of a second and opposite conductivity type formed in said first region and having first and second sides extending in parallel in one direction, a second rectangular region of said second conductivity type in said first region spaced apart from said first rectangular region, a first side of said second rectangular region facing said first side of said first rectangular region, said second rectangular region being elongated in said one direction in parallel with and not beyond said first side of said first rectangular region, a third rectangular region of said second conductivity type in said first region spaced apart from said first rectangular region, a first side of said third rectangular region facing said second side of said first rectangular region, said third rectangular region provided independently of said second rectangular region and extending in parallel in said one direction and not beyond said second side of said first rectangular region, a fourth rectangular region of said second conductivity type in said first region spaced apart from said second rectangular region, said fourth rectangular region facing a second side of said second rectangular region, said fourth rectangular region being elongated in said one direction in parallel with said second rectangular region with a length the same as that of said second rectangular region a fifth rectangular region of said second conductivity type in said first region spaced apart from said third rectangular region, said fifth rectangular region facing a second side of said third rectangular region, said fifth rectangular region being elongated in said one direction in parallel with said third rectangular region with a length the same as that of said third rectangular region, said fifth rectangular region being provided independently of said fourth rectangular region, said first, second, third, fourth, and fifth rectangular regions being spacially arranged along a single line, a first gate insulator film disposed on said first region between said first and second rectangular regions, a second gate insulator film disposed on said first region between said first and third rectangular regions, a third gate insulator film disposed on said first region between said second and fourth rectangular regions, a fourth gate insulator film disposed on said first region between said third and fifth rectangular regions, a first gate electrode on said first gate insulating film, a second gate electrode on said second gate insulator film and electrically connected to said first gate electrode, a third gate electrode on said third gate insulator film, a fourth gate electrode on said fourth gate insulator film and electrically connected to said third gate electrode, a first means for connecting said first and second gate electrodes in common, a second means for connecting said third and fourth gate electrodes in common, said first, second, and third rectangular regions as well as the commonly connected first and second of said gate electrodes constituting a first insulated gate field effect transistor, said second, fourth, third and fifth rectangular regions as well as the commonly connected third and fourth gate electrodes constituting a second insulated gate field effect transistor, a first input terminal connected to said first means, a second input terminal connected to said second means, an output terminal, and means for electrically connecting said first rectangular region to said output terminal.

5. A semiconductor integrated circuit of claim 4, further comprising means for supplying said first rectangular region with an electric charge.

6. A semiconductor integrated circuit of claim 4, in which said second and third rectangular regions are electrically floating and said fourth and fifth rectangular regions are supplied with a predetermined voltage.

* * * * *